United States Patent [19]

Paoli

[11] Patent Number: 5,071,786
[45] Date of Patent: Dec. 10, 1991

[54] METHOD OF MAKING MULTIPLE WAVELENGTH P-N JUNCTION SEMICONDUCTOR LASER WITH SEPARATED WAVEGUIDES

[75] Inventor: Thomas I. Paoli, Los Altos, Calif.

[73] Assignee: Xerox Corporation, Stamford, Conn.

[21] Appl. No.: 605,813

[22] Filed: Oct. 20, 1990

Related U.S. Application Data

[62] Division of Ser. No. 490,799, Mar. 8, 1990.

[51] Int. Cl.$^5$ ............................................. H01L 21/20
[52] U.S. Cl. .................................... 437/129; 437/987
[58] Field of Search ............... 148/DIG. 23, 38, 56, 148/65, 72, 71, 84, 94, 95, 33, 33.4, 33.5; 357/16, 17; 372/43, 45, 46, 50; 437/81, 97, 105, 107, 129, 133, 154, 160, 173, 935, 936, 954, 987

[56] References Cited

U.S. PATENT DOCUMENTS

| | | | |
|---|---|---|---|
| 4,476,563 | 10/1984 | Van Ruyven | 372/50 |
| 4,720,468 | 1/1988 | Manigaux et al. | 437/129 |
| 4,747,110 | 5/1988 | Takahashi et al. | 372/50 |
| 4,831,629 | 5/1989 | Paoli et al. | 372/46 |
| 4,925,811 | 5/1990 | Menigaux et al. | 437/129 |
| 4,947,401 | 8/1990 | Hinata et al. | 372/50 |
| 4,980,893 | 12/1990 | Thornton et al. | 372/46 |

FOREIGN PATENT DOCUMENTS

| | | | |
|---|---|---|---|
| 0061220 | 9/1982 | European Pat. Off. | 372/50 |
| 0079791 | 5/1983 | Japan | 372/50 |
| 0199583 | 11/1983 | Japan | 372/50 |
| 0072288 | 4/1985 | Japan | 437/129 |
| 0107885 | 6/1985 | Japan | 372/50 |

Primary Examiner—Olik Chaudhuri
Assistant Examiner—William D. Bunch
Attorney, Agent, or Firm—William Propp

[57] ABSTRACT

A multiple wavelength semiconductor laser with two active layers separated by either a p-cladding layer of a p-n junction cladding layers, A p-disordered region and a n-disordered region extend through one of the active layers and into the intermediate cladding layer. A lateral waveguide is formed between the disordered regions in the active layer and a deep waveguide is formed beneath the p-disordered region in the other active layer. Since both active layers generate lightwaves at different wavelengths, forward-biasing the p-disordered region can cause either or both waveguides to emit radiation but at different wavelengths. The deep waveguide can also be a buried heterostructure laser.

22 Claims, 1 Drawing Sheet

METHOD OF MAKING MULTIPLE WAVELENGTH P-N JUNCTION SEMICONDUCTOR LASER WITH SEPARATED WAVEGUIDES

This is a division of application Ser. No. 07/490,799, filed Mar. 8, 1990.

BACKGROUND OF THE INVENTION

This invention relates to semiconductor lasers and more particularly to multiple wavelength p-n junction lasers with separated waveguides.

In recent years, the technique of impurity induced disordering (IID) has been developed as a means for crafting semiconductor structures. This technique may be defined as a process of an enhanced rate of interdiffusion of ordered elemental constituents as initially formed in consecutively deposited layers of semiconductor compounds or alloys as a result of the introduction, i.e. diffusion, of an impurity into the layers. The utility of IDD, as discussed in K. Meehan et al., "Disorder of an $Al_xGa_{1-x}AsGaAs$ Superlattice by Donor Diffusion", Applied Physics Letters, Vol. 45 (5), pp. 549-551, Sept. 1, 1984 and in U.S. Pat. No. 4,639,275, has been demonstrated in the fabrication of buried heterostructure lasers, as per the article of R. L. Thornton et al. entitled "Highly Efficient, Long Lived AlGaAs Lasers Fabricated by Silicon Impurity Induced Disordering", Applied Physics Letters, Vol. 49 (3), pp. 133-134, July 21, 1986.

An alternate technique of disordering is possible through the implantation of elements acting as shallow or deep level impurities, such as Se, Ge, Mg, Sn, O, S, B, F, Be, Te, Si, Mn, Zn, Cd, Sn, or Cr, followed by a high temperature anneal at temperatures optimum to each particular impurity, e.g. 500° to 900° C. depending upon the particular type of impurity and best performed in the presence of excess column V element, e.g. As. It has also even been shown to be possible to disorder by implantation of III-V elements, such as Al or As. It has also been further shown possible to use a wide variety of elements to bring about disordering through implantation and annealing. For example, the inert element, Kr, has been shown to induce disordering. In the case of an impurity implant followed by an anneal, the anneal temperatures are relatively higher than diffusion temperatures, e.g. above 800° C.

Multiple-wavelength diode lasers are presently being developed as advanced sources for optical communications, optical disk systems, and other information processing applications. The approaches to monolithic fabrication of such sources have thus far utilized lasers built on either a single active layer or multiple active layers of different alloy composition and hence different bandgap energy.

One approach has been the integration of several lasers operating at different wavelengths into a single chip by utilizing DFB gratings with different periods for frequency selective optical feedback in each laser. A single active layer has also been used with a grating of a single period to operate two lasers at different wavelengths by changing the stripe width to vary the index of refraction. Varying the stripe width in Fabry-Perot lasers will control the cavity loss and thereby obtain lasing on either the first or second quantized energy levels of a single quantum well active layer.

Active layers of different composition were first used by Sakai, et al. to make LEDs and then lasers. In this approach, two active layers separated by a common clad layer are uniformly grown and then separately accessed by selectively removing one active layer in the post-growth processing. Etch-and-regrowth techniques have also been used to produce lateral regions of different alloy composition on which to fabricate two separate diode lasers emitting different wavelengths. Simultaneous lasing in four distinct wavelengths has been achieved by incorporating four active layers of different composition into the same optical waveguide. Recently, a graded growth technique has been developed for MBE to provide lateral variation lasing wavelength. These past approaches are described in J. E. Epler, D. W. Treat, S. E. Nelson, and T. L. Paoli, "Multiple-Wavelength Diode Laser Super Array", to be published in IEEE J. of Quantum Electronics, April 1990.

A p-n junction semiconductor can easily be used for a single waveguide, single wavelength laser. It is difficult, however, in a semiconductor structure with two separated waveguides to inject carriers into both waveguides with a planar p-n junction, since the layer or layers between the active waveguides will prevent injection of positive carriers into one waveguide and negative carriers into the other. Separate waveguides then require separate p-n junctions that must be separately addressed by removing layers in order to expose one access to one junction, as described in S. Sakai, T. Aoki, and M. Umeno, "InGaAsP/InP dual wavelength lasers," Electron. Lett., vol. 18, pp. 17-18, January 1982.

It is an object of this invention, therefore, to provide a multiple wavelength semiconductor laser that is simple to fabricate.

It is another object of this invention to provide a p-n junction semiconductor laser with separate waveguides emitting at different wavelengths that are individually addressable.

SUMMARY OF THE INVENTION

According to this invention, a multiple wavelength semiconductor laser has several semiconductor layers epitaxially deposited on a substrate. Two active layers are deposited separated by either a p-cladding layer or p-n junction cladding layers. A p-disordered region and a n-disordered region extend through the top semiconductor layers, one of the active layers and into the intermediate cladding layer or layers. A lateral waveguide is formed between the disordered regions in the active layer and a deep waveguide is formed beneath the p-disordered region in the other active layer. Since both active layers have different compositions, forward-biasing the p-disordered region can cause either or both waveguides to emit radiation but at different wavelengths. The deep waveguide can also be a buried heterostructure laser.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
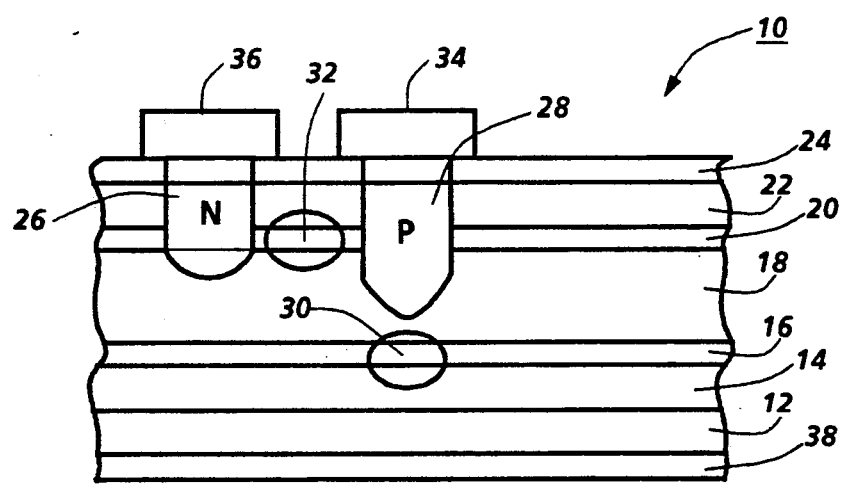
FIG. 1 is a schematic illustration of a side illustration of a multiple wavelength semiconductor laser formed according to this invention.

Reference is now made to FIG. 1, wherein there is illustrated a first embodiment of the multiple wavelength semiconductor laser of this invention.

Laser 10 comprises a substrate 12 of n-GaAs, upon which is epitaxially deposited a cladding layer 14 of n-Ga$_{1-x}$Al$_x$As; an active layer 16 for providing light wave generation and propagation under lasing conditions, active at a first wavelength, being nondoped or p-type or n-type, and which may comprise a GaAs active layer or a single quantum well, such as GaAs or Ga$_{1-y}$Al$_y$As where y<x, or a multiple quantum well superlattice, such as alternating layers of GaAs and Ga$_{1-y}$Al$_y$As where y<x or alternating layers of Ga$_{1-w}$Al$_w$As and Ga$_{1-B}$Al$_B$As where B<w<x; an inner cladding layer 18 of p-Ga$_{1-z}$Al$_z$As where B<w<z; a second active layer 20 for providing light wave generation and propagation under lasing conditions, active at a second wavelength different from the first wavelength of the first active region, being undoped or p-type or n-type, and which may comprise a GaAs active layer or a single quantum well, such as GaAs or Ga$_{1-y}$Al$_y$As where y<z or a multiple quantum well superlattice, such as alternating layers of GaAs and Ga$_{1-y}$Al$_y$As where y<z or alternating layers of Ga$_{1-w}$Al$_w$As and Ga$_{1-B}$Al$_B$As where B<w<z; a top cladding layer 22 of undoped Ga$_{1-C}$Al$_C$As where B<w<C; and a top cap layer 24 of undoped GaAs. The cap layer and the top cladding layer may be semi-insulating or have low carrier concentration.

As is known in the art, the epitaxial growth of laser 10 may be carried out by molecular beam epitaxy (MBE) or metalorganic chemical vapor deposition (MOCVD). Cladding layer 14 may have a thickness in the range of 0.1 to 1 micron. Active layers 16 and 20 may have a thickness between 0.01 to 0.1 micron depending upon the type of region. For example, the active region may comprise a multiple quantum well superlattice composed of several 60 angstrom thick GaAs wells separated by several 120 angstrom thick barriers of Ga$_{0.7}$Al$_{0.3}$As so that the total region thickness is about 0.08 microns. Cladding layers 14 and 18 and 22 may each have a thickness in the range of 0.1 to 1.0 microns. Cap layer 24 may have a thickness in the range of 0.1 to 0.2 micron.

There are alternate conventional techniques and diffusion/implant species for carrying out the desired disordering or the elemental implant/annealing technique as discussed previously. Discussion hereafter will be confined to impurity induced disordering. However, it should be noted that these other techniques and elemental diffusions or implants are equally applicable.

Upon completion of the epitaxial growth, a Si$_3$N$_4$ mask is formed on the top surface of the cap layer 24 with openings exposing regions of the laser structure to impurity induced disordering. The mask protects the unexposed regions which will form laser optical cavities and waveguides.

The optical cavities and waveguides are established by first selectively diffusing a high concentration n-impurity dopant, such as silicon, into the regions of the laser structure exposed through the mask. A silicon layer is deposited in the opening in the Si$_3$N$_4$ mask and then capped with an additional layer of Si$_3$N$_4$. The diffusion of silicon is accomplished at a temperature of approximately 800° C. and is maintained for a sufficiently long period of time, e.g. seven to eight hours, to penetrate active layer 20 and cladding layer 18.

The diffusion of silicon through the cap layer 24 of undoped GaAs into the shallower quantum well active region 20 and inner cladding layer 18 causes an intermixing of Ga and Al in the active layer 20 as well as the cladding layers 18 and 22, thereby forming an n-impurity induced disordered region 26.

Upon completion of the silicon diffusion step, a second Si$_3$N$_4$ mask is formed on the top surface of the cap layer 22 with openings exposing regions of the laser structure to impurity induced disordering as previously explained. This second mask exposes different regions than the first mask.

A high concentration p-impurity dopant, such as zinc, will be selectively diffused into the regions of the laser structure exposed by the second mask. The diffusion of zinc is accomplished at a relatively low temperature of approximately 600° C. in an evacuated heater, such as a semi-sealed graphite boat, containing appropriate diffusion sources and is maintained for a sufficiently long period of time, e.g. several hours, to penetrate active layer 20 and cladding layer 18.

The diffusion of the zinc through the cap layer 24 of undoped GaAs into the shallower quantum well active region 20 and inner cladding layers 18 and 22 causes an intermixing of Al and Ga resulting in a GaAlAs alloy of averaged AlAs mole fraction illustrates as p-impurity induced disordered region 28. In the case of an active layer 20 of GaAs or a single quantum well layer of GaAs or Ga$_{1-y}$Al$_y$As, the intermixing is between Ga in the active layer and Al in the adjacent cladding layers 18 and 22 of Ga$_{1-z}$Al$_z$As and Ga$_{1-C}$Al$_C$As. In the case of a multiple quantum well structure, the intermixing of Al and Ga is principally between the well and barrier layers.

After diffusion, the Si$_3$N$_4$ mask is removed from the top surface of the cap layer 24 by etching in a CF$_4$ plasma.

The p-disordered region 28 is forward-biased with respect to the n-cladding layer 14 beneath to cause the resulting deep waveguide 30 in the active layer 16 to emit radiation at the first wavelength.

The second mask has exposed different regions of the active layer 20 and cladding layer 18 than the first mask. The p-disordered region 28 and the n-disordered region 26 are both regions of lower refractive index compared to the undisordered region 32 in the active layer 20 between the two disordered regions, such that the region 32 may function as an optical waveguide or a diode laser optical cavity. This lateral waveguide 32 will emit radiation at the second wavelength when the p-disordered region is forward-biased with respect to the n-disordered region.

The cladding layer 16 between the two active layers has a refractive index low enough to confine the lightwaves emitted to each active waveguide.

The preferred method of diffusion is to diffuse the n-impurity silicon first because it moves through the various semiconductor layers slower and is diffused at a higher temperature than the diffusion of the p-impurity zinc. The silicon will continue to diffuse during the second step of the zinc diffusion but the silicon will move at a slower speed at this lower temperature. The silicon may be partially diffused during the silicon diffusion step with the silicon diffusion completed during the zinc diffusion step.

Time, temperature and control are counterbalancing variables in diffusing dopant elements. The higher the temperature, the faster the diffusion time, but the less control over the depth to which the dopant will diffuse down, and vice versa.

Other p-impurity dopants such as Be and Mg do not diffuse as fast as zinc through the various layers. This may be an advantage allowing for better control of the depth to which the p-impurity dopant will diffuse down. If a slowly diffusing p-type impurity is used, the p- and n-diffusion may be done at the same time by appropriate selection of the time/temperature cycle.

Other n-impurity dopant elements would include Ge and Sn. If the n-impurity dopant diffuses slower through the semiconductor layers than the p-impurity dopant, then the diffusion steps would be reversed, the p-type dopant would be diffused first and completed during the subsequent n-type dopant diffusion.

Different dopant elements diffuse at different rates through semiconductor layers and the order of the diffusion steps must be adjusted accordingly.

Upon completion of the diffusion steps, multiple wavelength semiconductor laser 10 is metallized with Cr-Au or Ti-Pt-Au contacts 34 and 36 applied to the top surface of cap layer 24 in order to separately contact the p and n regions 28 and 26 respectively and, alloyed Au-Ge, followed by Cr-Au or Ti-Pt-Au, as contact 38 applied to the bottom surface of substrate 12. P-contact 34, n-contact 36 and n-substrate contact 38 are individually addressable with the appropriate circuitry.

The multiple wavelength semiconductor laser 10 has a p-n junction between the p-disordered region 28 and the n-substrate 12. An additional p-n junction is formed between the p-disordered region 28 and the n-disordered region 26.

Forward-biasing the p-disordered region with respect only to the n-substrate will cause only the deep waveguide 30 to emit radiation at the first wavelength. Forward-biasing the p-disordered region with respect only to the n-disordered region will cause only the lateral waveguide 32 to emit radiation at the second wavelength. Forward-biasing the p-disordered region with respect to both the n-substrate and the n-disordered region will cause both the deep waveguide 30 and the lateral waveguide 32 to emit radiation at separate wavelengths.

Appropriate circuit connections between the p-contact and the two n-contacts allows independent control of either laser in the deep or lateral waveguides or simultaneous control of both lasers in the deep and lateral waveguides.

Figure 2:
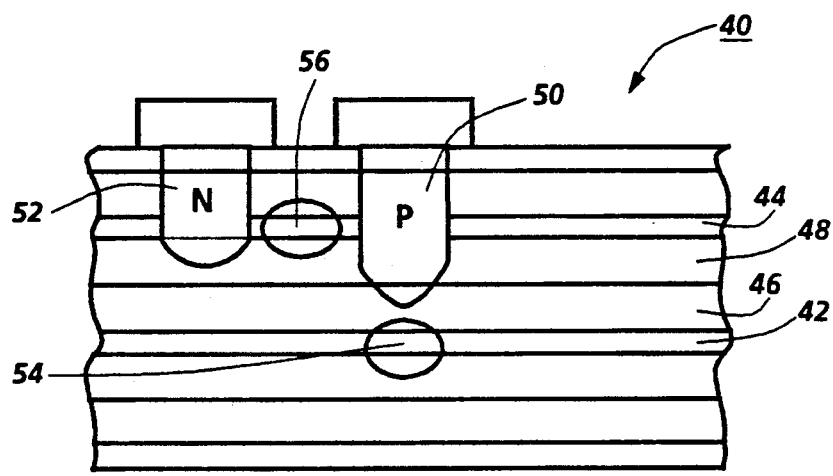
FIG. 2 is a schematic illustration of a side elevation of an alternate embodiment of a multiple wavelength semiconductor laser formed according to this invention.

In FIG. 2, multiple wavelength semiconductor laser 40 is of identical structure to laser 10 of FIG. 1, with a first active layer 42 and a second active layer 44, except that the p-cladding layer 18 in FIG. 1 has been replaced by a planar p-n junction comprising a p-cladding layer 46 of p-Ga$_{1-z}$Al$_z$As epitaxially deposited on the first active layer 42, followed by a n-cladding layer 48 of n-Ga$_{1-x}$Al$_x$As, and then the second active layer 44. The p-disordered region 50 will extend through the n-cladding layer 48 and into the p-cladding layer 46.

The n-disordered region 52 will extend only into the n-cladding layer 48.

This p-n junction in the cladding layer between the two active regions allows for improved electrical isolation of the two active regions. This mixed cladding also eases the placement of the p-disordered region close to the deep waveguide 54 and improves the efficiency of injecting carriers into the deep waveguide 54. The lateral waveguide 56 is the same as in FIG. 1.

Figure 3:
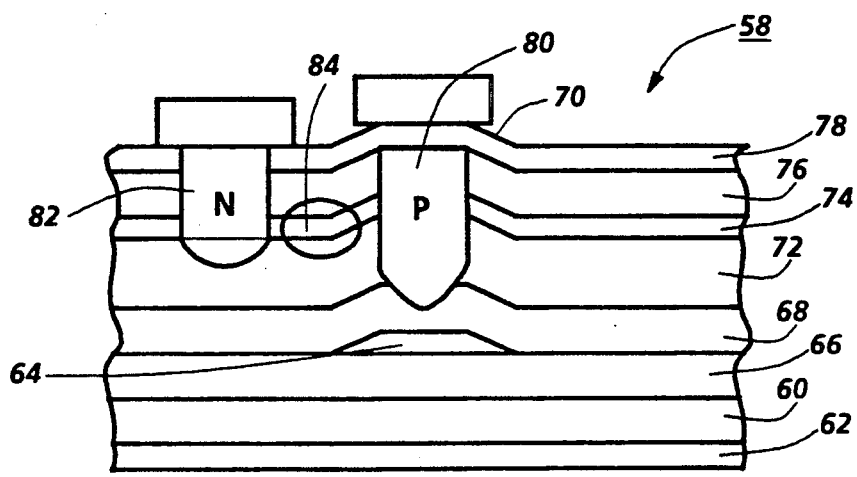
FIG. 3 is a schematic illustration of a side elevation of an embodiment of a multiple wavelength buried heterostructure semiconductor laser formed according to this invention.

In FIG. 3, multiple wavelength semiconductor laser 58 is of identical structure to laser 40 of FIG. 2, except that a first cladding layer 60 of n-Ga$_{1-y}$Al$_y$As is deposited on the substrate 62 and the first active region 64 of GaAs in the deep waveguide is completely surrounded by the cladding layer 66 of n-Ga$_{1-x}$Al$_x$As where $y > x \sim 0.1$ and the inner cladding layer 68 of p-Ga$_{1-z}$Al$_z$As where $y \leq z$.

First cladding layer 60 provides the optical confinement in the vertical direction, while the other cladding layer 66 provides only carrier confinement. In this structure the gain is only in the first active region 64 but the optical wave is in active region 64 and cladding layer 66. This is a strip buried heterostructure laser. Another possibility is to eliminate cladding layer 66 so that optical wave and carriers are both confined to active region 64. This is a buried heterostructure laser. The buried heterostructure has a lower lasing threshold but is more difficult to make.

This strip buried heterostructure laser 58, as is known in the art, has an active region or strip and waveguide completely surrounded by two layers of lower index of refraction material whose conductivity types are opposite to each other. Active region 64 can be formed by conventional etch and regrow techniques as shown in FIG. 3, or by regrowth in a groove or layer disordering from a buried source formed in situ or other processes as are known in the art but not shown in this Figure.

The buried active region 64 causes a resulting bulge 70 in the subsequently deposited semiconductor layers, inner cladding layer 68, n-cladding layer 72, second active layer 74, undoped layer 76 and cap layer 78. Forward bias of p-disordered region 80 with respect to the substrate 62 will still cause the active region 64 in the deep waveguide to emit radiation at a first wavelength. Forward bias of the p-disordered region 80 with respect to the n-disordered region 82 will still cause the second active region 84 in the lateral waveguide between the two disordered regions to emit radiation at the second wavelength.

The p- and n-conductivity types of the substrate, the semiconductor layers and the disordered regions of each of the various enbodiments can be uniformly reversed to form multiple wavelength semiconductor lasers.

In any embodiment of the present invention, arrays of lasers are possible by altering p- and n-disordered regions across the semiconductor layers and subtrate.

While the invention has been described in conjunction with specific embodiments, it is evident that many alternatives, modifications and variations will be apparent to those skilled in the art in light of the foregoing description. Accordingly, the invention is intended to embrace all such alternatives, modifications and variations as fall within the spirit and scope of the appended claims.

What is claimed is:

1. A method of fabricating a multiple wavelength semiconductor laser comprising the steps of:

depositing at least one semiconductor layer on a substrate, depositing a first active semiconductor layer for providing light wave generation and propagation under lasing conditions, active at a first wavelength, depositing at least one semiconductor layer on said first active layer, depositing a second active semiconductor layer for providing light wave generation and propagation under lasing conditions, active at a second wavelength, different from the first wavelength, depositing at least one semiconductor layers on said second active layer, disordering, with one conductivity type, a first region of said semiconductor layers and said second active layer and into said at least one semiconductor layer between said first and second active layers, and disordering, with the opposing conductivity type from the first disordered region, a second region of said semiconductor layers and said second active layer and into said at least one semiconductor layer between said first and second active layers, such that foward-biasing said second disordered region causes the second active layer between said second disordered region and said first disordered region to lase at said second wavelength and/or said first active layer to lase at said first wavelength.

2. The method of fabricating a multiple wavelength semiconductor laser of claim 1 wherein said disordering of said first and said second regions is by impurity induced disordering.

3. The method of fabricating a multiple wavelength semiconductor laser of claim 1 wherein said second disordered region is of a p-conductivity type and said first disordered region is of a n-conductivity type.

4. The method of fabricating a multiple wavelength semiconductor laser of claim 1 wherein second disordered region is disordered by diffusing zinc and said first disordered region is disordered by diffusing silicon.

5. The method of fabricating a multiple wavelength semiconductor laser of claim 1 wherein said second disordered region is of a n-conductivity type and said first disordered region is of a p-conductivity type.

6. A method of fabricating a multiple wavelength semiconductor laser comprising the steps of:

depositing at least one semiconductor layer on a substrate, depositing a first active semiconductor layer for providing light wave generation and propagation under lasing conditions, active at a first wavelength, depositing at least two semiconductor layers on said first active layer, one of said at least two layers being a first cladding layer having one conductivity type and one of said at least two layers being a second cladding layer having the opposing conductivity type, depositing a second active semiconductor layer providing light wave generation and propagation under lasing conditions, active at a second wavelength, different from the first wavelength, depositing at least one semiconductor layer on said active layer, disordering, with the same conductivity type as said second cladding layer, a first region of said at least one semiconductor layer on said second active layer and said second active layer and into said second cladding layer, and disordering, with the opposing conductivity type from the first disordered region and the same conductivity type as said first cladding layer, a second region of said at least one semiconductor layer on said second active layer, said second active layer, and said second cladding layer and into said first cladding layer, such that forward-biasing said second disordered region causes the second active layer between said second disordered region and said first disordered region to lase at said second wavelength and/or said first active layer to lase at said first wavelength.

7. The method of fabricating a multiple wavelength semiconductor laser of claim 6 wherein said disordering of said first and said second regions is by impurity induced disordering.

8. The method of fabricating a multiple wavelength semiconductor laser of claim 6 wherein said second disordered region and said first cladding layer are of p-conductivity type and said first disordered region and said cladding layer are of a n-conductivity type.

9. The method of fabricating a multiple wavelength semiconductor laser of claim 6 wherein second disordered region is disordered by diffusing zinc and said first disordered region is disordered by diffusing silicon.

10. The method of fabricating a multiple wavelength semiconductor laser of claim 6 wherein said second disordered region and said first cladding layer are of n-conductivity type and said first disordered region and said second cladding layer are of a p-conductivity type.

11. A method of fabricating a multiple wavelength semiconductor laser comprising the steps of:

depositing at least one semiconductor layer on a substrate, depositing a first active semiconductor layer for providing light wave generation and propagation under lasing conditions, active at a first wavelength, depositing at least one semiconductor layer on said first active layer, said at least one semiconductor layer on said first active layer and said at least one semiconductor layer on said substrate completely surrounding said first active layer, depositing a second active semiconductor layer for providing light wave generation and propagation under lasing conditions, active at a second wavelength, different from the first wavelength, depositing at least one semicondutor layer on said second active layer, disordering with one conductivity type, a first region of said semiconductor layer on said second active layer and said second active layer and into said at least one semiconductor layer between said first and second active layers, and disordering, with the opposing conductivity type from the first disordered region, a second region of said semiconductor layer on said second active layer and said second active layer and into said at least one semiconductor layer between said first and second active layers, such that foward-biasing said second disordered region causes the second active layer between said second disordered region and said first disordered region to lase at said second wavelength and/or said first active layer to lase at said first wavelength.

12. The method of fabricating a multiple wavelength semiconductor laser of claim 11 wherein said disordering of said first and said second regions is by impurity induced disordering.

13. The method of fabricating a multiple wavelength semiconductor laser of claim 11 wherein said disordered region is of a p-conductivity type and said first disordered region is of a n- conductivity type.

14. The method of fabricating a multiple wavelength semiconductor laser of claim 11 wherein second disordered region is disordered by diffusing zinc and said first disordered region is disordered by diffusing silicon.

15. The method of fabricating a multiple wavelength semiconductor laser of claim 11 wherein said second disordered region is of a n-conductivity type and said first disordered region is of a p-conductivity type.

16. The method of fabricating a multiple wavelength semiconductor laser of claim 11 wherein said at least one semiconductor layer deposited on a substrate includes a cladding layer.

17. A method of fabricating a multiple wavelength semiconductor laser comprising the steps of:

depositing at least one semiconductor layer on a substrate, depositing a first active semiconductor layer for providing light wave generation and propagation under lasing conditions, active at a first wavelength, depositing at least two semiconductor layers on said active layer, one of said at least two layers being a first cladding layer having one conductivity type and one of said at least two layers being a second cladding layer having the opposing conductivity type, said first cladding layer on said first active layer and said at least one semiconductor layer on said substrate completely surrounding said first active layer, depositing a second active semiconductor layer for providing light wave generation and propagation under lasing conditions, active at a second wavelength, different from the first wavelength, depositing at least one semiconductor layer on said second active layer, disordering, with the same conductivity type as said second cladding layer, a first region of said at least one semiconductor layer on said active layer and said second active layer and into said second cladding layer, and disordering, with the opposing conductivity type from the first disordered region and the same conductivity type as said first cladding layer, a second region of said at least one semiconductor layer on said second active layer, said second active layer, and said second cladding layer and into said first cladding layer, such that forward-biasing said second disordered region causes the second active layer between said second disordered region and said first disordered region to lase at said second wavelength and/or said first active layer to lase at said first wavelength.

18. The method of fabricating a multiple wavelength semiconductor laser of claim 17 wherein said disordering of said first and said second regions is by impurity induced disordering.

19. The method of fabricating a multiple wavelength semiconductor laser of claim 17 wherein said second disordered region and said first cladding layer are of p-conductivity type and said first disordered region and said second cladding layer are of a n-conductivity type.

20. The method of fabricating a multiple wavelength semiconductor laser of claim 17 wherein second disordered region is disordered by diffusing zinc and said first disordered region is disordered by diffusing silcon.

21. The method of fabricating a multiple wavelength semiconductor laser of claim 17 wherein said second disordered region and said cladding layer are of n-conductivity type and said first disordered region and said second cladding layer are of a p-conductivity type.

22. The method of fabricating a multiple wavelength semiconductor laser of claim 17 wherein said at least one semiconductor layer deposited on a substrate includes a cladding layer.

* * * * *